United States Patent
Fujioka et al.

(10) Patent No.: US 10,603,914 B2
(45) Date of Patent: Mar. 31, 2020

(54) MEMS DEVICE, LIQUID EJECTING HEAD, AND LIQUID EJECTING APPARATUS

(71) Applicant: SEIKO EPSON CORPORATION, Tokyo (JP)

(72) Inventors: Masashi Fujioka, Minowa-machi (JP); Eiju Hirai, Azumino (JP); Isao Yanagisawa, Chino (JP); Ikuya Miyazawa, Yamagata-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/188,768

(22) Filed: Nov. 13, 2018

(65) Prior Publication Data
US 2019/0143690 A1 May 16, 2019

(30) Foreign Application Priority Data
Nov. 15, 2017 (JP) .................. 2017-219720

(51) Int. Cl.
*B41J 2/14* (2006.01)
*H01L 23/00* (2006.01)
*H01L 41/047* (2006.01)
*H01L 41/09* (2006.01)

(52) U.S. Cl.
CPC .......... *B41J 2/14233* (2013.01); *H01L 24/14* (2013.01); *H01L 41/0475* (2013.01); *H01L 41/0973* (2013.01); *B41J 2/14201* (2013.01); *B41J 2002/14491* (2013.01); *B41J 2202/18* (2013.01); *H01L 2224/1403* (2013.01); *H01L 2224/16225* (2013.01); *H01L 2924/15311* (2013.01); *H01L 2924/3511* (2013.01)

(58) Field of Classification Search
CPC .......... B41J 2/14233; B41J 2002/14491; B41J 2202/18; B41J 2/14201; H01L 41/0475
See application file for complete search history.

(56) References Cited

U.S. PATENT DOCUMENTS

| | | | |
|---|---|---|---|
| 2006/0209126 A1 * | 9/2006 | Nomori | B41J 2/1609 347/45 |
| 2009/0032944 A1 | 2/2009 | Tanaka et al. | |
| 2011/0018110 A1 | 1/2011 | Tanaka et al. | |
| 2017/0217175 A1 * | 8/2017 | Hirai | B41J 2/04548 |
| 2018/0015717 A1 | 1/2018 | Tanaka | |

FOREIGN PATENT DOCUMENTS

| | | |
|---|---|---|
| JP | 2009-033010 A | 2/2009 |
| JP | 2016-172345 A | 9/2016 |

* cited by examiner

*Primary Examiner* — Geoffrey S Mruk
(74) *Attorney, Agent, or Firm* — Workman Nydegger

(57) ABSTRACT

In an MEMS device, in a Z direction that is a direction in which a first core portion, a plurality of first bump wiring, and a plurality of first individual wiring are laminated, a width between the first core portion and a wiring substrate is wider than a maximum particle diameter of solid particles contained in an adhesive, and a width between a first wiring and a second wiring and a width between a third wiring and a fourth wiring are wider than the maximum particle diameter of the solid particles.

11 Claims, 9 Drawing Sheets

MEMS DEVICE, LIQUID EJECTING HEAD, AND LIQUID EJECTING APPARATUS

The entire disclosure of Japanese Patent Application No. 2017-219720, filed Nov. 15, 2017 is expressly incorporated by reference herein.

BACKGROUND

1. Technical Field

The present invention relates to an MEMS device, a liquid ejecting head, and a liquid ejecting apparatus.

2. Related Art

In the related art, for example, a liquid ejecting head in which a driving IC and a sealing plate are bonded is known as disclosed in JP-A-2016-172345.

As disclosed in JP-A-2009-33010, a semiconductor device in which a semiconductor substrate and a circuit board are bonded is known.

In the liquid ejecting head disclosed in JP-A-2016-172345 and the semiconductor device disclosed in JP-A-2009-33010, an adhesive is used for bonding the substrates. The adhesive contains solid particles (such as curing agent, filler), and if the solid particles are unevenly distributed at the time of bonding the substrates, the bonding strength is lowered.

SUMMARY

The invention can be realized in the following aspects or application examples.

Application Example 1

According to this application example, there is provided an MEMS device including: a first substrate; a resin formed on the first substrate; a plurality of wirings including a first wiring and a second wiring formed on the resin; a second substrate bonded to the plurality of wirings; and a plurality of wirings including a third wiring and a fourth wiring formed on the second substrate. The first substrate and the second substrate are bonded to each other via an adhesive, the first substrate and the second substrate are electrically connected to each other via the first wiring and the third wiring, the first substrate and the second substrate are electrically connected to each other via the second wiring and the fourth wiring, and the adhesive contains solid particles. In a first direction that is a direction in which the resin and the plurality of wirings are laminated, a width between the resin and the second substrate is wider than a maximum particle diameter of the solid particles, and a width between the first wiring and the second wiring or a width between the third wiring and the fourth wiring is wider than the maximum particle diameter of the solid particles.

According to the application example, since the width of the region (bonding region) surrounded by the second substrate, the resin, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 2

In the MEMS device according to the application example, in a cross-sectional view in the first direction, a film thickness of the resin in a region between the first wiring and the second wiring is preferably thinner than the film thickness of the resin in a region where the first wiring or the second wiring is formed.

According to the application example, since the width of the region (bonding region) surrounded by the second substrate, the resin, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 3

In the MEMS device according to the application example, a film thickness of the first wiring and the second wiring or a film thickness of the third wiring and the fourth wiring is preferably thicker than the maximum particle diameter of the solid particles.

According to the application example, since the width of the region (bonding region) surrounded by the second substrate, the resin, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 4

In the MEMS device according to the application example, in a cross-sectional view in the first direction, a thickness of the second substrate in a region between the third wiring and the fourth wiring is preferably thinner than a thickness of the second substrate in a region where the third wiring or the fourth wiring is formed.

According to the application example, since the width of the region (bonding region) surrounded by the second substrate, the resin, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 5

According to this application example, there is provided an MEMS device including: a first substrate; a plurality of bumps including a first bump and a second bump formed on the first substrate; a second substrate bonded to the plurality of bumps; and a plurality of wirings including a third wiring and a fourth wiring formed on the second substrate. The first substrate and the second substrate are bonded to each other via an adhesive, the first substrate and the second substrate are electrically connected to each other via the first bump and the third wiring, the first substrate and the second substrate are electrically connected to each other via the second bump and the fourth wiring, and the adhesive contains solid particles. In a first direction that is a direction in which the first substrate and the second substrate are laminated, a width between the first substrate and the second substrate is wider than a maximum particle diameter of the solid particles, and a width between the first bump and the second bump or a width between the third wiring and the fourth wiring is wider than the maximum particle diameter of the solid particles.

According to the application example, since the width of a region (bonding region) surrounded by the first substrate, the second substrate, the plurality of bumps, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 6

In the MEMS device according to the application example, a film thickness of the first bump and the second bump or a film thickness of the third wiring and the fourth wiring is preferably thicker than the maximum particle diameter of the solid particles.

According to the application example, since the width of a region (bonding region) surrounded by the first substrate, the second substrate, the plurality of bumps, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 7

In the MEMS device according to the application example, in a cross-sectional view in the first direction, a thickness of the second substrate in a region between the first bump and the second bump is preferably thinner than the thickness of the second substrate in a region to be bonded to the first bump or the second bump.

According to the application example, since the width of a region (bonding region) surrounded by the first substrate, the second substrate, the plurality of bumps, and the plurality of wirings is wider than the maximum particle diameter of the solid particles contained in the adhesive, when the adhesive flows in the bonding region at the bonding of the substrates, the solid particles such as a curing agent and a filler contained in the adhesive easily spread to the bonding region, and the solid particles are uniformly distributed in the bonding region. Thereby, the bonding strength between the substrates can be improved.

Accordingly, a highly reliable MEMS device may be provided.

Application Example 8

According to this application example, there is provided a liquid ejecting head including the MEMS device.

According to the application example, a highly reliable liquid ejecting head may be provided.

Application Example 9

According to this application example, there is provided a liquid ejecting apparatus including the liquid ejecting head.

According to the application example, a highly reliable liquid ejecting apparatus may be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. In the following drawings, the scale of each layer and each member is made different from the actual scale in order to make each layer and each member to be recognizable size.

Figure 1:
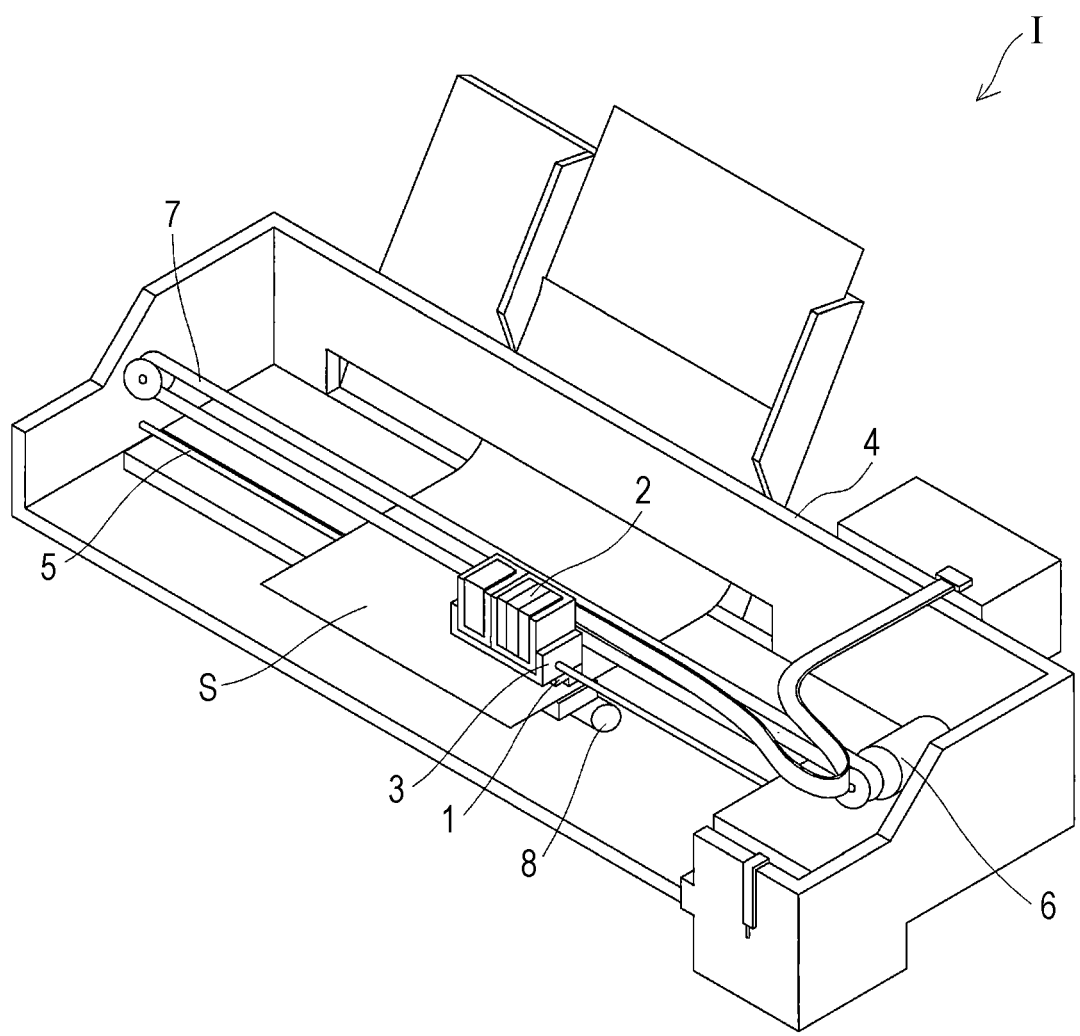
FIG. 1 is a perspective view showing a configuration of an ink jet type liquid ejecting apparatus.
Figure 1:
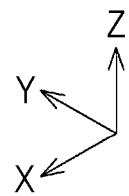

An ink jet type liquid ejecting apparatus will be explained as an example of a liquid ejecting apparatus. FIG. 1 is a schematic view showing the ink jet type liquid ejecting apparatus. As shown in FIG. 1, in an ink jet type liquid ejecting apparatus I, a cartridge 2 that constitutes an ink supply unit is attachable and detachably provided in a liquid ejecting head 1, and a carriage 3 on which the liquid ejecting head 1 is mounted is provided so as to be movable in the axis direction on a carriage shaft 5 attached to an apparatus main body 4.

The carriage 3 on which the liquid ejecting head 1 is mounted is moved along the carriage shaft 5 by transmitting driving force generated by a driving motor 6 is transmitted to the carriage 3 via a plurality of gears (not shown) and a timing belt 7. Meanwhile, a transport roller 8 serving as a transport unit is provided in the apparatus main body 4, and a recording sheet S which is a recording medium such as paper or the like is transported by the transport roller 8. The transport unit that transports the recording sheet S is not limited to a transport roller, and may be a belt, a drum, or the like.

In the above-described the ink jet type liquid ejecting apparatus I, the liquid ejecting head 1 mounted on the carriage 3 and moving in a main scanning direction is described as an example. However, the invention is not particularly limited thereto. For example, the invention can be also applied to a so called line type liquid ejecting apparatus in which the liquid ejecting head 1 is fixed and printing is performed by moving the recording sheet S such as paper in a sub-scanning direction.

In the above-described example, the ink jet type liquid ejecting apparatus I has a configuration in which the cartridge 2 serving as a liquid storage unit is mounted in the carriage 3. However, the invention is not particularly limited thereto. For example, the liquid storage unit such as an ink tank may be fixed to the apparatus main body 4, and the liquid storage unit and the liquid ejecting head 1 may be connected to each other via a supply pipe such as a tube. The liquid storage unit may not be mounted on the ink jet type liquid ejecting apparatus.

The invention is applicable in all heads, and can be applied to, for example, a liquid ejecting head such as various types of ink jet type liquid ejecting heads used in an image recording apparatus such as a printer, a color material ejecting head used in manufacture of a color filter for a liquid crystal display and the like, an electrode material ejecting head used in formation of an electrode for an organic EL display, an FED (field emission display), and the like, and a bioorganic ejecting head used in manufacture of a biochip, and the like, and so on.

Embodiment 1

Figure 2:
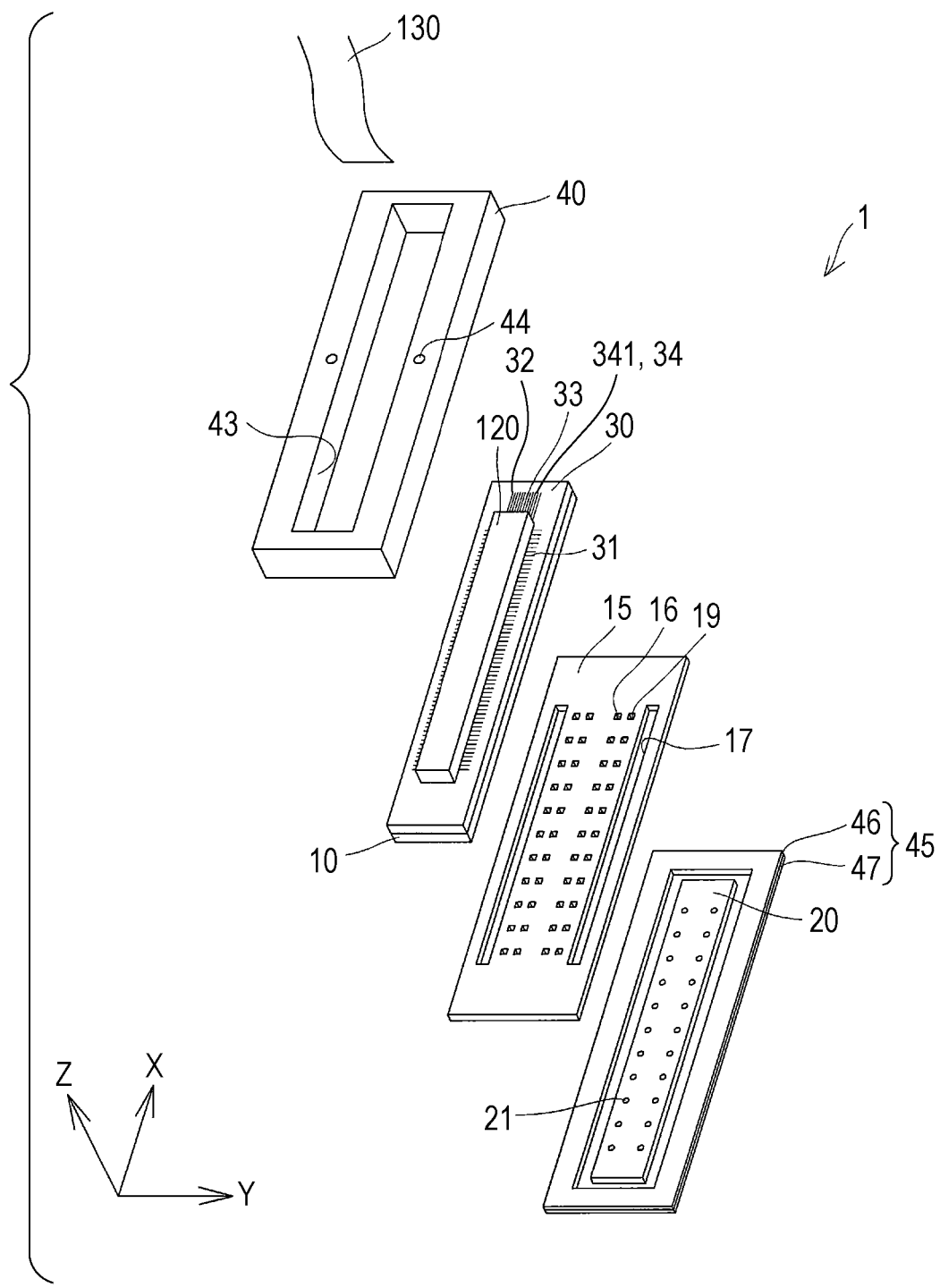
FIG. 2 is an exploded perspective view of a liquid ejecting head according to Embodiment 1.
Figure 3:
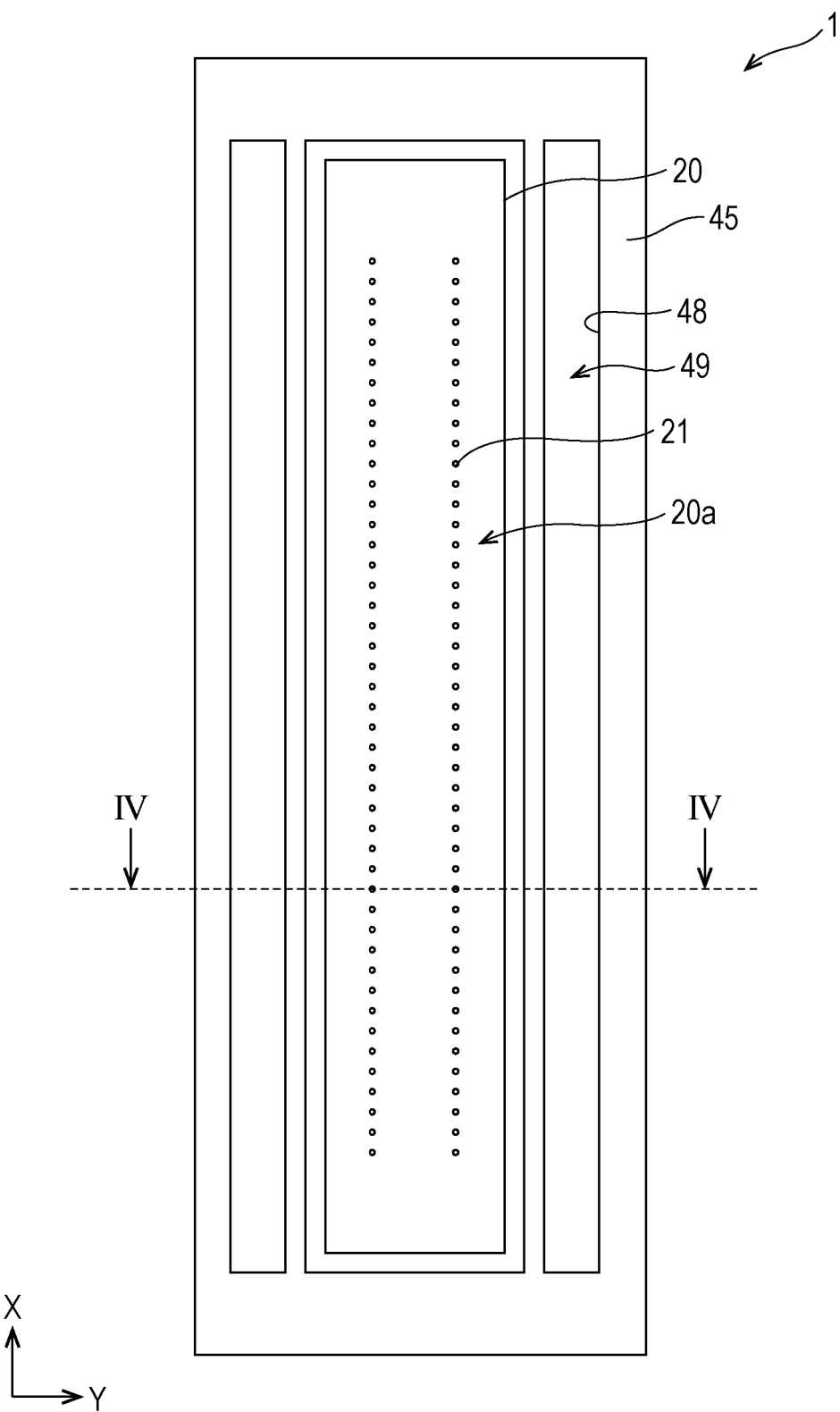
FIG. 3 is a plan view on a liquid ejecting surface side of a liquid ejecting head according to Embodiment 1.
Figure 4:
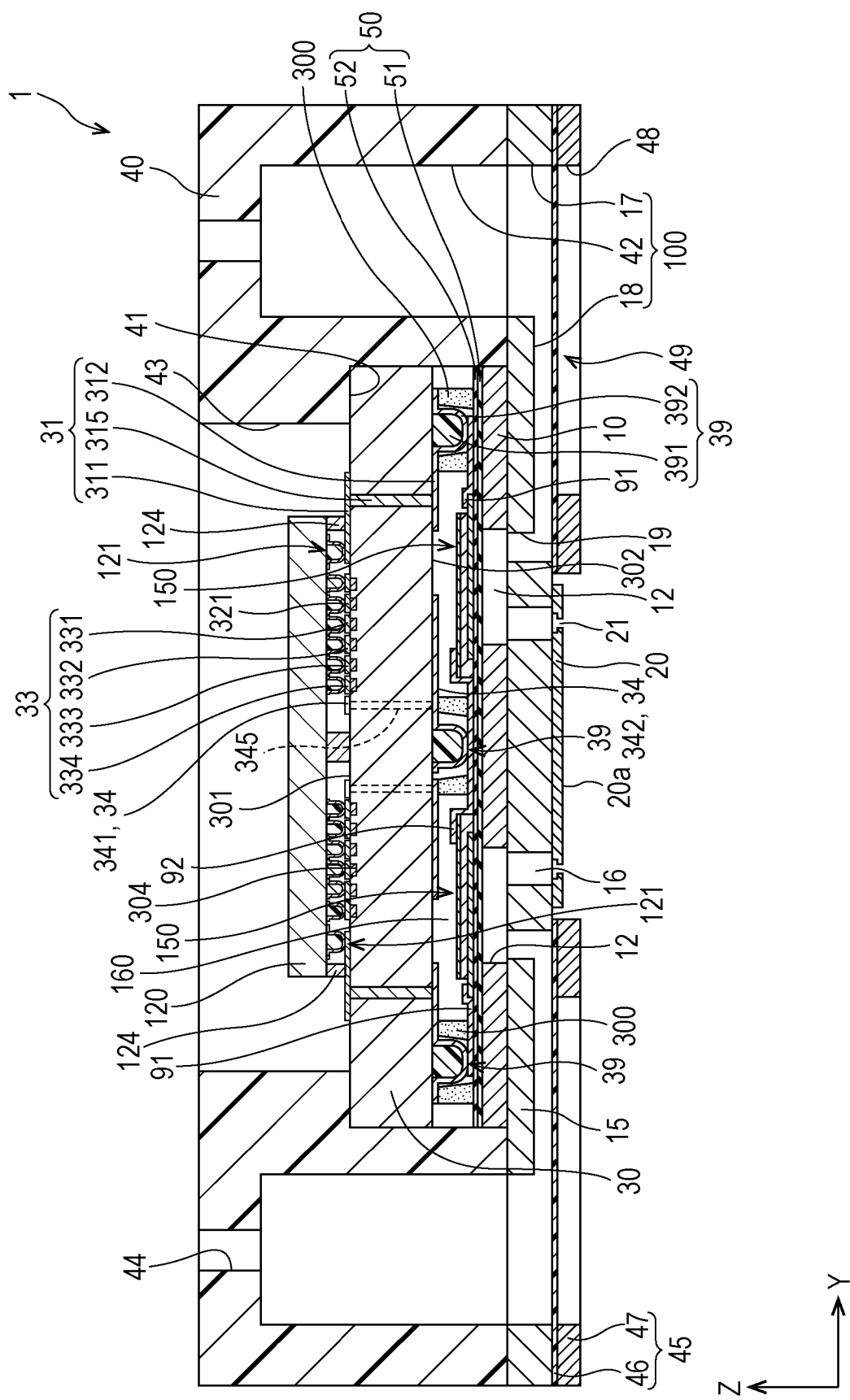
FIG. 4 is a cross-sectional view taken along a line IV-IV of FIG. 3 according to Embodiment 1.
Figure 5:
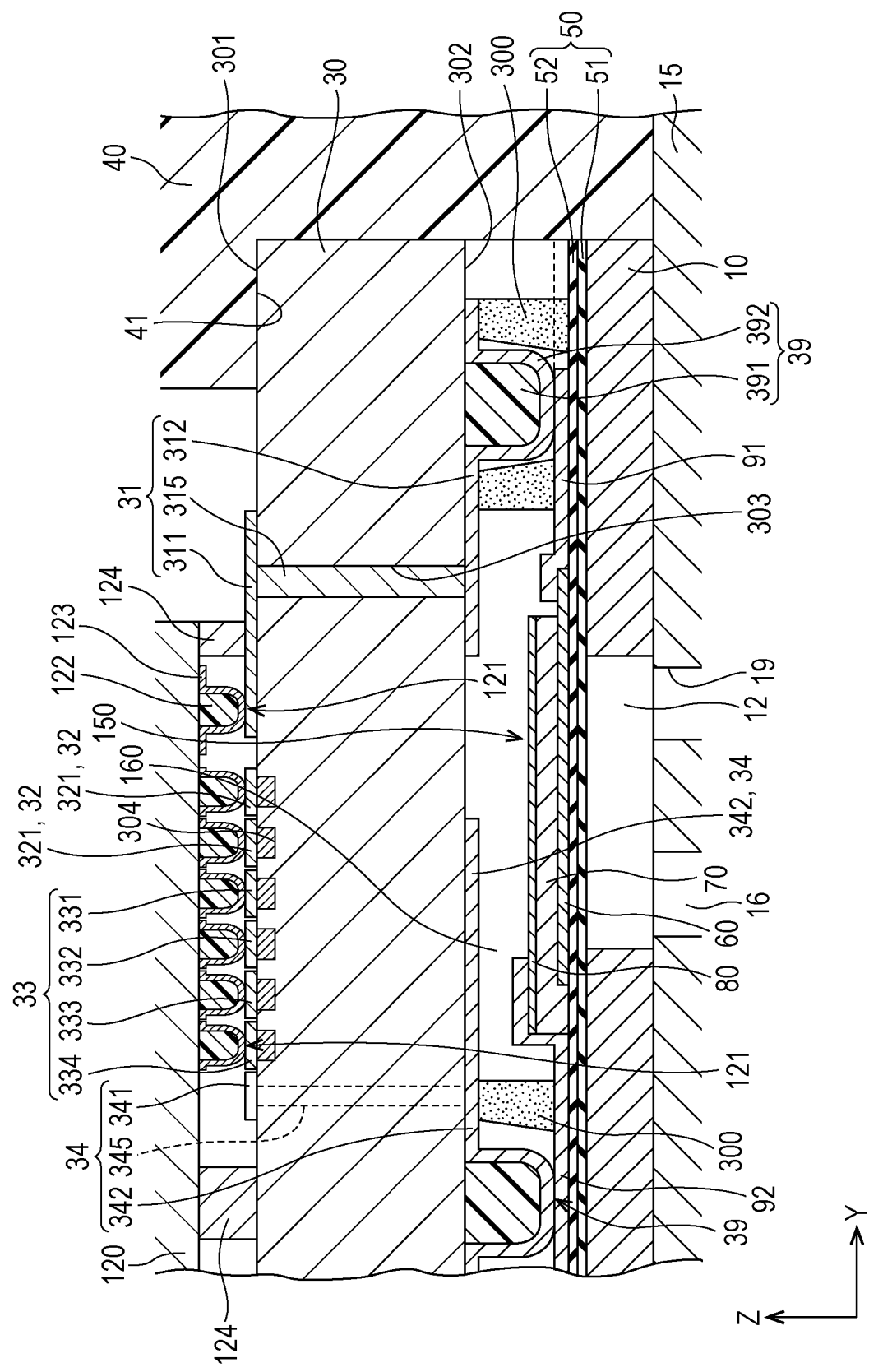
FIG. 5 is an enlarged sectional view of a main portion of FIG. 4 according to Embodiment 1.
Figure 6:
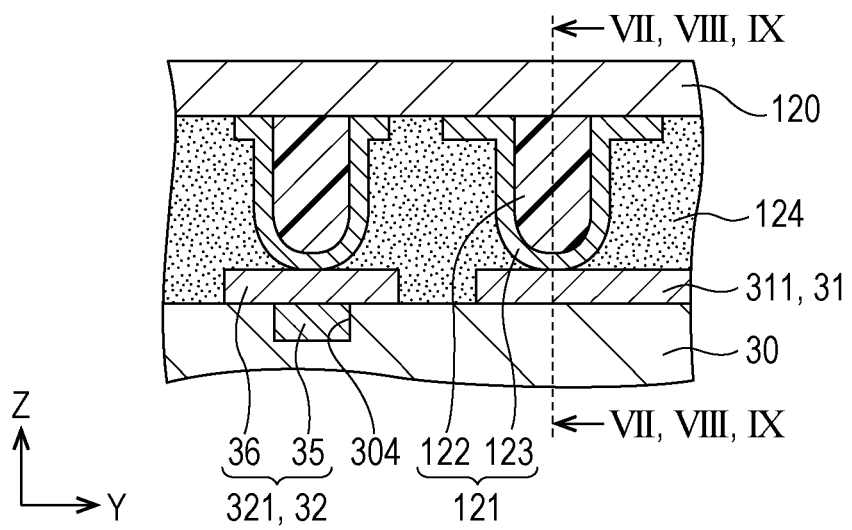
FIG. 6 is a sectional view further enlarged the main portion of FIG. 5 according to Embodiment 1.
Figure 7:
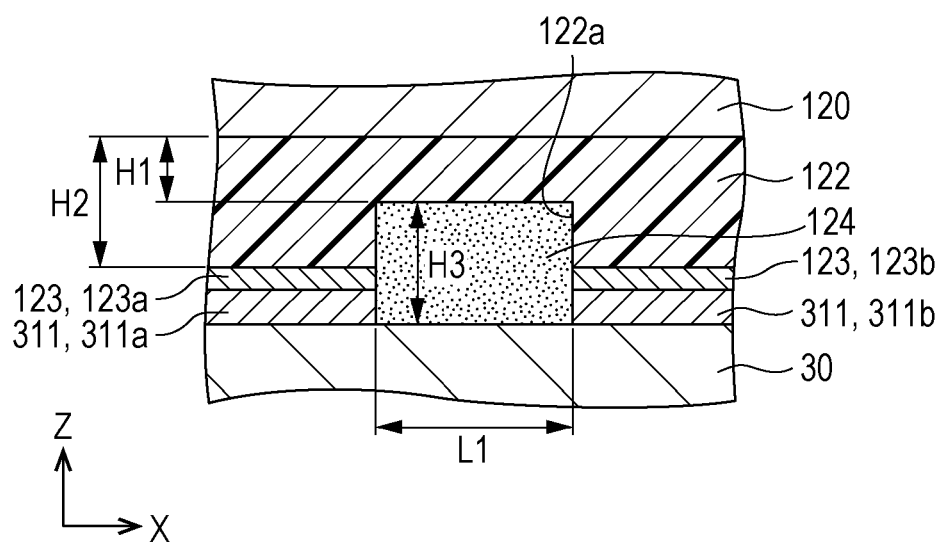
FIG. 7 is a cross-sectional view taken along a line VII-VII of FIG. 6 according to Embodiment 1.

FIG. 2 is an exploded perspective view of the ink jet type liquid ejecting head which is an example of a liquid ejecting head according to Embodiment 1 of the invention, FIG. 3 is a plan view (plan view on liquid ejecting surface 20a side) of the ink jet type liquid ejecting head, FIG. 4 is a cross-sectional view taken along a line IV-IV of FIG. 3, FIG. 5 is an enlarged sectional view of a main portion of FIG. 4, FIG. 6 is a sectional view further enlarged the main portion of FIG. 5, and FIG. 7 is a cross-sectional view taken along a line VII-VII of FIG. 6.

As shown in FIGS. 2 to 7, the ink jet type liquid ejecting head 1 (hereinafter, referred to as liquid ejecting head 1) which is an example of the liquid ejecting head of the present embodiment includes a plurality of members such as a flow channel formation substrate 10, a communication plate 15, a nozzle plate 20, a wiring substrate 30 (second substrate), a driving circuit 120 (first substrate) of the present embodiment, and a compliance substrate 45. An MEMS device of the present embodiment includes pressure generation chambers 12 laminated on the communication plate 15, the wiring substrate 30, the driving circuit 120, and the like. The flow channel formation substrate 10 can be formed from a metal such as a stainless steel or Ni, a ceramic material represented by $ZrO_2$ or $Al_2O_3$, a glass ceramic material, or an oxide such as $SiO_2$, MgO, or $LaAlO_3$. In the present embodiment, the flow channel formation substrate 10 is made of a silicon single crystal substrate. In the flow channel formation substrate 10, the pressure generation chambers 12 defined by a plurality of partitions are juxtaposed along a direction in which a plurality of nozzle openings 21 that eject ink are juxtaposed by performing anisotropic etching from one surface side. Hereinafter, the direction is referred to as an arrangement direction of the pressure generation chambers 12, a second direction, or an X axis direction. In the flow channel formation substrate 10, a plurality of rows in which the pressure generation chambers 12 are juxtaposed in the second direction, two rows in the present embodiment, are provided. Hereinafter, the row direction in which a plurality of rows of the pressure generation chambers 12 in which the pressure generation chambers 12 are formed along the second direction is referred to as a third direction, or a Y axis direction. In the present embodiment, a direction intersecting both the second direction and the third direction is referred to as a first direction, or a Z axis direction. The coordinate axes in each of drawings represent the second direction, the third direction, and the first direction, with directions to which the arrows head being positive (+) directions, and directions opposite thereto being negative (−) directions. In the present embodiment, the relationship in which each direction (X, Y, Z) is orthogonal to each other is adopted. However, the arrangement relationship of each configuration is not necessarily limited thereto.

In the flow channel formation substrate 10, a supply channel that has an opening area narrower than corresponding pressure generation chamber 12 and applies flow channel resistance for ink flowing into the pressure generation chambers 12, and the like may be provided on one end side of the pressure generation chambers 12 in the third direction. On one surface side (side opposite to wiring substrate 30 and in-first direction) of the flow channel formation substrate 10, the communication plate 15 and the nozzle plate 20 are sequentially laminated. That is, the communication plate 15 provided on one surface of the flow channel formation substrate 10 and the nozzle plate 20 which has the nozzle openings 21 on a side of the communication plate 15 opposite to the flow channel formation substrate 10 are furnished.

The communication plate 15 is provided with nozzle communication channels 16 that communicate the pressure generation chambers 12 and the nozzle openings 21. The communication plate 15 has an area larger than the flow channel formation substrate 10, and the nozzle plate 20 has an area smaller than the flow channel formation substrate 10. Since the nozzle openings 21 on the nozzle plate 20 and the pressure generation chambers 12 are separated from each other by providing the communication plate 15 as described above, the ink in the pressure generation chambers 12 is less likely affected by an increase in viscosity caused by evaporation of water content in the ink near the nozzle openings 21. Since the nozzle plate 20 only needs to cover the openings of nozzle communication channels 16 that communicate the pressure generation chambers 12 and the nozzle openings 21, the area of the nozzle plate 20 can be relatively reduced, and the cost can be reduced. In the present embodiment, the surface on which the nozzle openings 21 of the nozzle plate 20 are opened and ink droplets are ejected is referred to as the liquid ejecting surface 20a.

The communication plate 15 is provided with a first manifold portion 17 and a second manifold portion 18 which constitute a portion of a manifold 100. The first manifold portion 17 is provided penetrating the communication plate 15 in a thickness direction (laminating direction of the communication plate 15 and the flow channel formation substrate 10). The second manifold portion 18 is provided opened on the nozzle plate 20 side of the communication plate 15 without penetrating the communication plate 15 in the thickness direction.

The communication plate 15 is provided with a supply communication channel 19 that communicates with the one end portion of the pressure generation chambers 12 in the third direction is independently provided for each pressure generation chamber 12. The supply communication channels 19 communicate the second manifold portion 18 and the pressure generation chambers 12.

The communication plate 15 can be formed from a metal such as a stainless steel or Ni, a ceramic material represented by $ZrO_2$ or $Al_2O_3$, a glass ceramic material, or an oxide such as $SiO_2$, MgO, or $LaAlO_3$. The communication plate 15 is preferably made of a material having the same coefficient of linear expansion with the flow channel formation substrate 10. That is, in a case where a material having a greatly different coefficient of linear expansion from the flow channel formation substrate 10 is used as the communication plate 15, warping occurs due to the difference in coefficient of linear expansion between the flow channel formation substrate 10 and the communication plate 15 as a result of heating and cooling. In the present embodiment, by using the same material with the flow channel formation substrate 10, that is, a silicon single crystal substrate as the communication plate 15, it is possible to suppress the occurrence of warpage caused by heat, cracking and peeling caused by heat, and the like. The nozzle openings 21 that communicate via each pressure generation chamber 12 and nozzle communication channel 16 are formed on the nozzle plate 20. Such nozzle openings 21 are juxtaposed in the second direction, and two rows of the nozzle openings 21 juxtaposed in the second direction are formed in the third direction.

The nozzle plate 20 can be formed from, for example, a metal such as stainless steel (SUS), an organic material such as a polyimide resin, or a silicon single crystal substrate. By using a silicon single crystal substrate as the nozzle plate 20, the coefficients of linear expansion of the nozzle plate 20 and the communication plate 15 are the same, and it is possible to suppress the occurrence of warpage caused by heating or cooling, cracking and peeling caused by heat, and the like.

Meanwhile, a vibration plate 50 is formed on a side (wiring substrate 30 side, and +first direction) of the flow channel formation substrate 10 opposite to the communication plate 15. In the present embodiment, an elastic film 51 made of silicon oxide provided on the flow channel formation substrate 10 side and an insulating film 52 made of zirconium oxide provided on the elastic film 51 are provided as the vibration plate 50. A liquid flow channel such as the pressure generation chambers 12 is formed by performing anisotropic etching on the flow channel formation substrate 10 from one surface side (surface to which the communication plate 15 is bonded), and the other surface of the liquid flow channel such as the pressure generation chambers 12 is formed by being partitioned by the elastic film 51. Naturally, the vibration plate 50 is not particularly limited to this. Either one of the elastic film 51 and the insulating film 52 may be provided, or another film may be provided.

On the vibration plate 50 of the flow channel formation substrate 10, a piezoelectric actuator 150 is provided as a driving element that generates pressure change in the ink in the pressure generation chambers 12 of the present embodiment. As described above, a plurality of pressure generation chambers 12 are juxtaposed along the second direction, and two rows of the pressure generation chambers 12 are juxtaposed along the third direction on the flow channel formation substrate 10. In the piezoelectric actuator 150, an active portion, which is a substantial driving portion, is juxtaposed in the second direction to form a row, and two rows of the active portions of the piezoelectric actuator 150 are juxtaposed in the third direction. That is, the driving element is substantially the active portion of the piezoelectric actuator 150. In the present embodiment, a driving element substrate provided with the active portion of the piezoelectric actuator 150 which is the driving element corresponds to the flow channel formation substrate 10.

The piezoelectric actuator 150 has a first electrode 60, a piezoelectric layer 70, and a second electrode 80 sequentially laminated from the vibration plate 50 side. The first electrode 60 that constitutes the piezoelectric actuator 150 is sectioned by each pressure generation chamber 12, and constitutes an independent individual electrode for each active portion serving as the substantial driving portion of the piezoelectric actuator 150. The piezoelectric layer 70 is continuously provided along the second direction so that the third direction has a predetermined width.

An end portion of the piezoelectric layer 70 on the one end side (side opposite to manifold 100) of the pressure generation chambers 12 in the third direction is located outside from an end portion of the first electrode 60. That is, an end portion of the first electrode 60 is covered with the piezoelectric layer 70. An end portion of the piezoelectric layer 70 on the other side which is the manifold 100 side of the pressure generation chambers 12 in the third direction is located inside (pressure generation chambers 12 side) from an end portion the first electrode 60, and an end portion of the first electrode 60 on the manifold 100 side is not covered with the piezoelectric layer 70.

The piezoelectric layer 70 is made of a piezoelectric material of an oxide having a polarization structure formed on the first electrode 60, and can be made of, for example, perovskite oxide represented by general formula $ABO_3$. As the perovskite oxide used in the piezoelectric layer 70, for example, a lead-based piezoelectric material containing lead, or a lead-free piezoelectric material containing no lead can be used.

Although not specifically shown, the piezoelectric layer 70 may have a recessed portion formed at a position corresponding to each partition between the pressure generation chambers 12. Accordingly, it is possible to favorably displace the piezoelectric actuator 150.

The second electrode 80 is provided on a side of the piezoelectric layer 70 opposite to the first electrode 60, and constitutes a common electrode common to a plurality of active portions. Displacement is caused in the piezoelectric actuator 150 including the first electrode 60, the piezoelectric layer 70, and the second electrode 80 as described above by applying a voltage between the first electrode 60 and the second electrode 80. That is, by applying a voltage between the electrodes, piezoelectric strain is generated in the piezoelectric layer 70 interposed between the first electrode 60 and the second electrode 80. A portion (region interposed between first electrode 60 and second electrode 80) where the piezoelectric strain occurs in the piezoelectric layer 70 when a voltage is applied to the electrodes is referred to as an active portion. On the other hand, a portion where no piezoelectric strain occurs in the piezoelectric layer 70 is referred to as an inactive portion. A portion of the piezoelectric actuator 150 which can be changed in opposition to the pressure generation chambers 12 is referred to as a flexible portion, and a portion outside the pressure generation chambers 12 is referred to as a non-flexible portion.

As described above, individual electrodes are formed by independently providing the first electrode 60 for each of the plurality of active portions, and a common electrode is formed by continuously providing the second electrode 80 over the plurality of active portions in the piezoelectric actuator 150. Naturally, the invention is not limited to such an embodiment. A common electrode may be formed by continuously providing the first electrode 60 over the plurality of active portions and individual electrodes may be formed by independently providing the second electrode 80 for each of the plurality of active portions. As the vibration plate 50, only the first electrode 60 may act as a vibration plate without providing the elastic film 51 and the insulating film 52. The piezoelectric actuator 150 itself may also substantially act as a vibration plate. In the present embodiment, the active portion of the piezoelectric actuator 150 is juxtaposed with respect to the pressure generation chambers 12 in the second direction, and two rows of the active portions juxtaposed in the second direction are juxtaposed in the third direction.

As shown in FIGS. 4 and 5, an individual lead electrode 91, which is a lead-out wiring, is drawn out from the first electrode 60 of the piezoelectric actuator 150. The individual lead electrode 91 is drawn to an outside of the row from the active portion of each row in the third direction.

A common lead electrode 92, which is a lead-out wiring, is drawn out from the second electrode 80 of the piezoelectric actuator 150. In the present embodiment, the common lead electrode 92 is electrically connected to the second electrode 80 of each of the two rows of the piezoelectric actuators 150. One common lead electrode 92 is provided for the plurality of active portions.

The wiring substrate 30 is bonded to a surface of the flow channel formation substrate 10 on the piezoelectric actuator 150 side. The wiring substrate 30 has substantially the same size as the flow channel formation substrate 10. The wiring substrate 30 can be formed from a metal such as a stainless steel or Ni, a ceramic material represented by $ZrO_2$ or $Al_2O_3$, a glass ceramic material, or an oxide such as $SiO_2$, MgO, or $LaAlO_3$. In the present embodiment, the wiring substrate 30 is made of a silicon single crystal substrate whose surface orientation is preferentially orientated in a (110) surface. A surface (+Z) on the side opposite to the piezoelectric actuator 150 which is a driving element of the wiring substrate 30 is referred to as a first surface 301, and a surface (−Z) of the wiring substrate 30 on the piezoelectric actuator 150 side is referred to as a second surface 302. As shown in FIGS. 2 and 4, and the like, the driving circuit 120 for outputting a signal for driving the piezoelectric actuator 150 is mounted on the first surface 301 of the wiring substrate 30. That is, the first surface 301 on the side opposite to the piezoelectric actuator 150 which is the driving element of the wiring substrate 30 is the driving circuit 120 side.

In the driving circuit 120, a switching element such as a transmission gate is provided for each active portion of the piezoelectric actuator 150, and an ejection signal that drives the active portion of the piezoelectric actuator 150 at a predetermined timing is generated from an externally provided drive signal (COM) by opening and closing the switching element based on an input control signal. Here, the ejection signal is represented by a signal for driving the active portion of the piezoelectric actuator 150 which is a driving element to eject the ink droplets from the nozzle openings 21. However, the ejection signal is not limited thereto, and it also includes other signals for driving such as a microvibration drive for driving the active portion of the piezoelectric actuator 150 such an extent that the ink droplets are not ejected. As such a driving circuit 120, for example, a circuit board or a semiconductor integrated circuit (IC) can be used. The active portion of the piezoelectric actuator 150 is driven by supplying the ejection signal generated from the drive signal (COM) to the first electrode 60 which is an individual electrode of each active portion of the piezoelectric actuator 150 by the driving circuit 120, and supplying a bias voltage (VBS) as a reference potential to the second electrode 80 which is a common electrode of the plurality of active portions.

Such a wiring substrate 30 is provided so that the X axis direction, which is an arrangement direction of the active portions of each row of the piezoelectric actuator 150, is elongated. That is, the wiring substrate 30 is disposed such that the X axis direction thereof is the longitudinal direction and the Y axis direction thereof is the transverse direction.

As shown in FIGS. 5 and 6, a first individual wiring 311 constituting an individual wiring 31, a drive signal wiring 32, a power supply wiring 33, and a first bias wiring 341 constituting a bias wiring 34 are provided on the first surface 301 of the wiring substrate 30.

One end of the individual wiring 31 is connected to the driving circuit 120, and the other end is electrically connected to the first electrode 60 which is an individual electrode of the active portion of the piezoelectric actuator 150 so that the ejection signal from the driving circuit 120 is supplied to the first electrode 60 of the piezoelectric actuator 150.

A plurality of first individual wirings 311 constituting the individual wiring 31 are juxtaposed in the X axis direction to each end portion of the first surface 301 of the wiring substrate 30 in the Y axis direction. The first individual wiring 311 extends along the Y axis direction, one end thereof is electrically connected to each terminal of the driving circuit 120, and the other end thereof is electrically connected to a first through wiring 315.

Here, the first through wiring 315 is provided inside a first through-hole 303 provided through the wiring substrate 30 in the Z axis direction which is the thickness direction, and is a wiring which connects the first individual wiring 311 of the first surface 301 and a second individual wiring 312 of the second surface 302 described in detail later by relaying the first surface 301 and the second surface 302. The first through-hole 303 in which the first through wiring 315 is provided can be formed by subjecting the wiring substrate 30 to laser processing, drill processing, dry etching processing (Bosch method, non-Bosch method, ion milling), inductively coupled plasma (ICP) processing, wet etching processing, sandblasting processing, and the like. The first through wiring 315 fills the first through-hole 303. The first through wiring 315 is made of a metal such as copper (Cu), and can be formed by electrolytic plating, electroless plating or the like.

The first through wiring 315 is connected to the second individual wiring 312 on the second surface 302. The second individual wiring 312 is electrically connected to the individual lead electrode 91 connected to the first electrode 60 which is an individual electrode of the active portion of the piezoelectric actuator 150, which will be described in detail later. That is, the same number of individual wirings 31 constituted by the first individual wiring 311, the first through wiring 315, and the second individual wiring 312 as the number of the first electrodes 60 which are individual electrodes of the active portions of the piezoelectric actuator 150 are provided.

The drive signal wiring 32 is provided on the first surface 301 of the wiring substrate 30. The drive signal wiring 32 supplies the drive signal (COM) supplied from an external wiring 130 to the driving circuit 120. The drive signal wiring 32 of the present embodiment extends from one end side connected with the external wiring 130 to the other end side along the X axis direction of the wiring substrate 30. In the present embodiment, two wirings for each row of the piezoelectric actuator 150, a total of four drive signal wirings 32 are juxtaposed in the Y axis direction.

The power supply wiring 33 is provided on the first surface 301 of the wiring substrate 30. The power supply wiring 33 supplies power to the driving circuit 120. In the present embodiment, the power supply wiring 33 includes a high voltage power supply wiring 331 for supplying high voltage power for a high voltage circuit of the driving circuit 120, a high voltage ground wiring 332 corresponding thereto, a low voltage power supply wiring 333 for supplying a low voltage power for a low voltage circuit to the driving circuit 120, and a low voltage ground wiring 334 corresponding thereto. That is, four types of power supply wirings 33 are provided in the present embodiment.

Such a power supply wiring 33 is provided from one end side connected with the external wiring 130 to the other end side along the X axis direction of the wiring substrate 30. The high voltage power supply wiring 331, the high voltage ground wiring 332, the low voltage power supply wiring 333, and the low voltage ground wiring 334 are provided one by one for each row of the active portions of the piezoelectric actuator 150, that is, four wirings for each row of the active portions of the piezoelectric actuator 150, a total of eight wirings are provided. The high voltage power supply wiring 331, the high voltage ground wiring 332, the low voltage power supply wiring 333, and the low voltage ground wiring 334 are juxtaposed in the Y axis direction. The drive signal wiring 32 corresponding to each row of the active portions of the piezoelectric actuator 150 is disposed on one side with respect to the power supply wiring 33, outside from the power supply wiring 33 of the wiring substrate 30 in the Y axis direction in the present embodiment. That is, the power supply wiring 33 is disposed on the center side of the wiring substrate 30 in the Y axis direction, and the drive signal wiring 32 is disposed on the outside of the wiring substrate 30.

The first bias wiring 341 constituting the bias wiring 34 is provided on the wiring substrate 30 of the first surface 301. The bias wiring 34 supplies the bias voltage (VBS) supplied from the external wiring 130 to the second electrode 80 which is a common electrode of the active portion of the piezoelectric actuator 150.

The first bias wiring 341 is provided along the X axis direction on one end side to which the external wiring 130 of the wiring substrate 30 is connected in the X axis direction, and has a length shorter than the drive signal wiring 32 and the power supply wiring 33. That is, since the first bias wiring only needs to be directly connected to the second electrode 80 which is a common electrode of the piezoelectric actuator 150 without being connected to the driving circuit 120, the first bias wiring is provided with a length that does not reach a region where the driving circuit 120 is mounted in the X axis direction. In the present embodiment, the first bias wiring 341 is provided on the side opposite to the drive signal wiring 32 of the power supply wiring 33 in the Y axis direction, that is, on the center side that is the inner side of the wiring substrate 30 from the power supply wiring 33. In the present embodiment, one wiring for each piezoelectric actuator 150, a total of two first bias wirings 341 are provided.

As shown in FIG. 6, the drive signal wiring 32 and the power supply wiring 33 include a first buried wiring 35 buried in a first groove 304 provided on the first surface 301 of the wiring substrate 30 and a first connection wiring 36 provided so as to cover the first buried wiring 35, respectively.

Here, the first groove 304 provided with the first buried wiring 35 has an inner surface formed by a first (111) surface perpendicular to the (110) surface of the surface of the wiring substrate 30, and a second (111) surface opposed to the first (111) surface and perpendicular to the (110) surface. The first groove 304 can be formed with high accuracy by performing anisotropic etching (wet etching) on the wiring substrate 30 using an alkaline solution such as potassium hydroxide aqueous solution (KOH) or tetramethylammonium hydroxide (TMAH). In the present embodiment, the first (111) surface and the second (111) surface which are the inner surface of the first groove 304 are disposed so as to be linear along the X axis direction. The first groove 304 and the first buried wiring 35 can be elongated in the X axis direction and formed in a space-saving manner by forming the inner surface of the first groove 304 so as to be linear along the X axis direction. For example, the arrangement direction of the active portions of the piezoelectric actuator 150 and a surface direction of the first (111) surface and the second (111) surface of the wiring substrate 30 may be made different from each other. In the present embodiment, the first groove 304 and the first buried wiring 35 are provided along the straight line. However, the invention is not limited thereto. For example, the first groove 304 and the first buried wiring 35 may be bent in an extending direction.

The first groove 304 formed this way has a rectangular cross section. The first groove 304 is not limited to one formed by anisotropic etching, and may be formed by laser processing, drill processing, dry etching processing, inductively coupled plasma (ICP) processing, sandblasting processing, and the like.

In the present embodiment, a plurality of first grooves 304 are provided at equal intervals in the Y axis direction. In the present embodiment, six grooves for each row of the active portions of the piezoelectric actuator 150, a total of twelve first grooves 304 are provided. Specifically, a total of six first grooves 304, two grooves for the drive signal wiring 32 and four grooves for the power supply wiring 33, are provided with respect to each row of the piezoelectric actuator 150. The number and position of the first grooves 304 corresponding to the drive signal wiring 32 and the power supply wiring 33 are not particularly limited thereto, and may be one, or two or more.

The first buried wiring 35 is buried in the first groove 304. That is, the first buried wiring 35 is formed fills the first groove 304. The first buried wiring 35 is formed of a metal such as copper (Cu), and for example, may be formed by a method such as electrolytic plating, electroless plating, printing of a conductive paste, or the like. The first buried wiring 35 can also be formed simultaneously with the first through wiring 315 by the plating. By simultaneously forming the first buried wiring 35 and the first through wiring 315, the manufacturing process can be simplified and the cost can be reduced.

The first connection wiring 36 is laminated so as to cover each first buried wiring 35. The first connection wiring 36 has a width slightly wider than that of the first buried wiring 35 in the Y axis direction, and the drive signal wiring 32 and the power supply wiring 33 adjacent to each other in the Y axis direction are spaced apart from each other so as not to be mutually short-circuited. The drive signal wiring 32 and the power supply wiring 33 of the present embodiment are constituted by one first buried wiring 35 and one first connection wiring 36.

Although not particularly shown, the first connection wiring 36 can be formed from, for example, a laminate of an adhesion layer of titanium (Ti) or the like provided on the first buried wiring 35 side and a conductive layer of gold (Au) or the like provided on the adhesion layer. A layer formed of any other conductive materials may be laminated. The first connection wiring 36 can be formed by, for example, a sputtering method or the like. For example, the first connection wiring 36 can be simultaneously formed with the first individual wiring 311. By simultaneously forming the first connection wiring 36 and the first individual wiring 311, the manufacturing process can be simplified and the cost can be reduced.

The above-described adhesion layer and conductive layer can be used as protective films against migration and oxidation of the buried wiring. The above-described conductive layer can be used as a bonding surface with bumps formed on another driving circuit board, a flexible tape (FPC), and a chip on film/flex (COF).

Although not particularly shown, the first connection wiring 36 extends to the outside of the end portion of the first buried wiring 35 in the X axis direction, and is provided up to a vicinity of the end portion of the wiring substrate 30 in the X axis direction. As described above, the external wiring 130 such as the FPC is electrically connected to the first connection wiring 36 extending up to one end portion of the wiring substrate 30 in the X axis direction. The drive signal (COM) is supplied to the drive signal wiring 32 to which the external wiring 130 is connected, power is supplied to the power supply wiring 33, and the bias voltage (VBS) is supplied to the first bias wiring 341. The first individual wiring 311, the drive signal wiring 32, and the power supply wiring 33 are electrically connected to each terminal (not shown) of the driving circuit 120 on the first surface 301. Although not particularly shown, a wiring that supplies control signals such as a clock signal (CLK), a latch signal (LAT), a change signal (CH), pixel data (SI), and setting data (SP) for controlling the driving circuit 120 from external wiring 130 are provided on the first surface 301 of the wiring substrate 30, the wiring is electrically connected to the external wiring 130, and the wiring is electrically connected to each terminal of the driving circuit 120.

Here, after the first buried wiring 35 made of metal such as copper (Cu) is formed in the first groove 304 by a method such as electrolytic plating, electroless plating, or printing of a conductive paste, the surface of the first surface 301 of the wiring substrate 30 is polished by a chemical mechanical polishing (CMP) to flatten the surface. At this time, since different materials of the wiring substrate 30 made of silicon and the first buried wiring 35 made of a metal such as copper (Cu) are simultaneously polished, although not shown, first buried wiring 35 is removed from the surface of the first surface 301 of the wiring substrate 30 and retracts. That is, the surface of the first buried wiring 35 on the first surface 301 side is cut and recessed than the first surface 301. Since the first connection wiring 36 is formed with substantially the same thickness when the first connection wiring 36 is formed over a surface of the wiring substrate 30 and the surface of the first buried wiring 35 on the first surface 301 of the wiring substrate 30, a recess along the recess of the first buried wiring 35 is formed on the first connection wiring 36 covering the surface of the first buried wiring 35, that is, the surface of the drive signal wiring 32 and the power supply wiring 33. On the other hand, on the surface the first connection wiring 36 not covering the first buried wiring 35, that is, the surface of the first individual wiring 311, a recess is not formed. Therefore, there is a difference between a surface height of the first individual wiring 311 connected to the driving circuit 120 from the first surface 301 and a surface height of the first connection wiring 36 connected to the driving circuit 120 from the first surface 301. That is, the interface of a connection portion where the drive signal wiring 32 and the power supply wiring 33 having the first buried wiring 35 are connected to a first bump electrode 121 (driving circuit 120) is located closer to the wiring substrate 30 side than the interface of the connection portion where the first individual wiring 311 is connected to the first bump electrode 121 (driving circuit 120).

Here, if metal bumps formed only with metals such as gold bumps are used when the driving circuit 120 is mounted on the first individual wiring 311 (a plurality of wirings including third wiring and fourth wiring), and the drive signal wiring 32 and the power supply wiring 33, since the metal bumps are hardly deformed, it is necessary to cause warpage in the driving circuit 120 and the wiring substrate 30 until the difference between the surfaces of the first individual wiring 311, and the drive signal wiring 32 and the power supply wiring 33 is absorbed. That is, in order to warp the driving circuit 120 and the wiring substrate 30 and absorb the difference in the surfaces, the driving circuit 120 needs to be pushed toward the wiring substrate 30 with a high load.

Therefore, in the present embodiment, as shown in FIGS. 5 and 6, a first bump electrode 121 is provided on the surface of the driving circuit 120 on the wiring substrate 30 side, and each terminal (not shown) of the driving circuit 120 is electrically connected to the first individual wiring 311, the drive signal wiring 32, and the power supply wiring 33 via the first bump electrode 121, respectively.

In the present embodiment, the connection state between the first bump electrode 121 and the first individual wiring 311, the drive signal wiring 32, and the power supply wiring 33 is maintained by bonding the driving circuit 120 and the wiring substrate 30 with a thermosetting adhesive 124.

Here, the first bump electrode 121 includes, for example, a first core portion 122 (resin) formed of an elastic resin material and a first bump wiring 123 (a plurality of wirings including first wiring and second wiring) which is a first wiring covering at least a portion of the surface of the first core portion 122.

The first core portion 122 is made of a material having elasticity and insulating properties, for example, a resin such as a photosensitive insulating resin such as a polyimide resin, an acrylic resin, phenol resin, a silicone resin, a silicone modified polyimide resin, or an epoxy resin, or a thermosetting insulating resin.

The first core portion 122 is formed in a substantially semicylindrical shape before connecting the driving circuit 120 and the wiring substrate 30. Here, the semicylindrical shape means a columnar shape in which the inner surface (bottom surface) in contact with the driving circuit 120 is flat and the outer surface side which is a non-contact surface is a curved surface. Specifically, the substantially semicylindrical shape includes those having a substantially semicircular cross section, a substantially semielliptic cross section, and a substantially trapezoidal cross section.

The first core portion 122 is pressed so that the driving circuit 120 and the wiring substrate 30 are relatively close to each other so that the shape of the tip end thereof is elastically deformed to follow the surface shape of the first individual wiring 311, the drive signal wiring 32, and the power supply wiring 33. As a result, even if the driving circuit 120 and the wiring substrate 30 have warpage or waviness, the first bump electrode 121 and the first individual wiring 311, the drive signal wiring 32, and the power supply wiring 33 can be reliably connected to each other as the first core portion 122 deforms following the deformation.

As shown in FIGS. 6 and 7, the first core portion 122 is linearly formed continuously along the X axis direction. A plurality of first core portions 122 are juxtaposed in the Y axis direction. In the present embodiment, the first core portions 122 provided at both end portions of the driving circuit 120 in the Y axis direction constitute a first bump electrode 121 connected to the first individual wiring 311. The first core portion 122 provided on the center side of the driving circuit 120 in the Y axis direction constitutes the first bump electrode 121 connected to the drive signal wiring 32 and the power supply wiring 33. Such a first core portion 122 can be formed by a photolithography technique or an etching technique.

In the cross section in the Z axis direction shown in FIG. 7 (cross sectional view in the first direction), a film thickness H1 of the first core portion 122 in the region between a first bump wiring 123a (first wiring) and a first bump wiring 123b (second wiring) formed on the surface of the first core portion 122 is formed thinner than a film thickness H2 of the region where the first bump wiring 123a or the first bump wiring 123b is formed. That is, a recessed portion is formed in the first core portion 122. Here, a width H3 from an upper surface of the wiring substrate 30 to a recess bottom surface 122a of the first core portion is formed so as to be wider than the maximum particle diameter of the solid particles contained in the adhesive 124.

L1, which is the width between the first bump wiring 123a (first wiring) and the first bump wiring 123b (second wiring) adjacent in the X axis direction or the width between the first individual wiring 311a (third wiring) and the first individual wiring 311b (fourth wiring) adjacent in the X axis direction, is formed so as to be wider than the maximum particle diameter of the solid particles contained in the adhesive 124.

In the present embodiment, L1, which is the width between the first bump wiring 123a (first wiring) and the first bump wiring 123b (second wiring) adjacent in the X axis direction and the width between the first individual wiring 311a (third wiring) and the first individual wiring 311b (fourth wiring) adjacent in the X axis direction, is wider than the maximum particle diameter of the solid particles contained in the adhesive 124.

Here, the maximum length of the largest particle among particles such as a curing agent and a filler contained in the adhesive is referred to as the maximum particle diameter. The particle size can be measured by, for example, an electronic microscope.

The first bump wiring 123 covers at least a portion of the surface of the first core portion 122. Such a first bump wiring 123 is formed of, for example, a metal or an alloy such as Au, TiW, Cu, Cr (chromium), Ni, Ti, W, NiV, Al, Pd (palladium), and lead free solder, and these monolayers or laminates of a plurality of kinds may be used. The first bump wiring 123 is deformed following the surface shape of the first individual wiring 311, the drive signal wiring 32, and the power supply wiring 33 by the elastic deformation of the first core portion 122, and are electrically bonded to the first individual wiring 311, the drive signal wiring 32, and the power supply wiring 33, respectively. Therefore, the load of pressing the driving circuit 120 against the wiring substrate 30 can be made lower than that of the metal bump, and warping of the driving circuit 120 and the wiring substrate 30 can be reduced. It is preferable that such a first core portion 122 be made of a material having elasticity that is deformed before the driving circuit 120 and the wiring substrate 30 warp. That is, it is preferable to use a material having a Young's modulus lower than that of the driving circuit 120 and the wiring substrate 30 as the first core portion 122.

As shown in FIG. 5, the second individual wiring 312 constituting the individual wiring 31 and a second bias wiring 342 constituting the bias wiring are provided on the second surface 302 of the wiring substrate 30.

The second individual wiring 312 is electrically connected to the first through wiring 315 and is electrically connected to the individual lead electrode 91 provided on the flow channel formation substrate 10. The second individual wiring 312 supplies the ejection signal from the driving circuit 120 to the first electrode 60 which is an individual electrode of the active portion of the piezoelectric actuator 150 via the first bump electrode 121, the first individual wiring 311, the first through wiring 315, the second individual wiring 312, and the individual lead electrode 91.

Specifically, a plurality of second individual wirings 312 are juxtaposed on both end portions of the wiring substrate 30 in the Y axis direction over the X axis direction. The second individual wiring 312 extends along the Y axis direction, and is electrically connected to the first through wiring 315 by covering an end portion of the first through wiring 315 at one end. That is, the individual wiring 31 includes the first individual wiring 311 provided on the first surface 301, the first through wiring 315, and the second individual wiring 312 provided on the second surface 302. The second individual wiring 312 is electrically connected to the individual lead electrode 91 provided on the flow channel formation substrate 10 by a second bump electrode 39 which will be described in detail later.

As shown in FIGS. 4 and 5, the second bias wiring 342 is electrically connected to a second through wiring 345 and electrically connected to the common lead electrode 92 provided on the flow channel formation substrate 10. The second bias wiring 342 supplies the bias voltage (VBS) supplied from the external wiring 130 to the second electrode 80 which is the common electrode of the active portion of the piezoelectric actuator 150 via the first bias wiring 341, the second through wiring 345, the second bias wiring 342, and the common lead electrode 92. That is, the bias wiring 34 that supplies the bias voltage (VBS) to the piezoelectric actuator 150 includes the first bias wiring 341, the second through wiring 345, and the second bias wiring 342 provided on the first surface 301. The second bias wiring 342 extends along the X axis direction, and one wiring for each row of the piezoelectric actuator 150, a total of two second bias wirings 342 are juxtaposed in the Y axis direction.

By providing the second bias wiring 342 constituting the bias wiring 34 on the second surface 302 in this manner, it is unnecessary to provide the bias wiring 34 on the first surface 301 along the X axis direction and a space for providing the bias wiring 34 on the first surface 301 along the X axis direction becomes unnecessary, and thereby, downsizing of the wiring substrate 30 can be achieved. That is, by providing the second bias wiring 342 which is a main portion of the bias wiring 34 on the second surface 302 having more space than the first surface 301, it is possible to suppress the increase in the size of the wiring substrate 30, and thereby, downsizing of the wiring substrate 30 can be achieved.

Here, the second individual wiring 312 and the second bias wiring 342 are electrically connected to the individual lead electrode 91 and the common lead electrode 92 via the second bump electrode 39, respectively.

The second bias wiring 342 extends between the second individual wirings 312 juxtaposed in the Y axis direction. In this extended portion, the second bias wiring 342 is connected to the common lead electrode 92 provided on the flow channel formation substrate 10 via the second bump electrode 39 as shown in FIGS. 4 and 5.

Here, similar to the first bump electrode 121 provided in the driving circuit 120 described above, the second bump electrode 39 includes a second core portion 391 made of an elastic resin material and a second bump wiring 392 which is a second wiring covering at least a portion of the surface of the second core portion 391.

The second core portion 391 is formed with the same cross sectional shape by using the same material as the first core portion 122 constituting the first bump electrode 121 of the driving circuit 120 described above. The second core portion 391 as described above is linearly disposed continuously in the X axis direction. In the Y axis direction, a total of three second core portions 391 are provided; one for each, two second core portions 391 in total, of the outside of two rows of active portions of the piezoelectric actuator 150, one second core portions 391 between two rows of active portions of the piezoelectric actuator 150. Each second core portion 391 provided outside the two rows of the active portions of piezoelectric actuators 150 constitutes the second bump electrode 39 for connecting the second individual wiring 312 to the individual lead electrode 91. The second core portion 391 provided between two rows of the active portions of the piezoelectric actuator 150 constitutes the second bump electrode 39 for connecting the second bias wiring 342 and the common lead electrode 92 of the two rows of piezoelectric actuators 150.

The second bump wiring 392 constituting the second bump electrode 39 for connecting the second individual wiring 312 to the individual lead electrode 91 uses the second individual wiring 312 as the second bump wiring 392 by extending the second individual wiring 312 to above the second core portion 391 in the present embodiment.

Similarly, the second bump wiring 392 constituting the second bump electrode 39 for connecting the second bias wiring 342 to the common lead electrode 92 uses the second bias wiring 342 as the second bump wiring 392 by extending the second bump wiring 392 above the second core portion 391 in the present embodiment. Naturally, the second individual wiring 312, the second bias wiring 342, and the second bump wiring 392 may be formed as separate wirings, and a portion of them may be laminated to be electrically connected.

The second bias wiring 342 extends to above the second core portions 391 at a plurality of positions at predetermined intervals along the X axis direction. That is, a plurality of second bump electrodes 39 connecting the second bias wiring 342 and the common lead electrode 92 are provided at predetermined intervals along the X axis direction. Such a second bias wiring 342 is electrically connected to the first bias wiring 341 of the first surface 301 via the second through wiring 345 as described above. Therefore, it is possible to substantially reduce the electric resistance value of the bias wiring 34 over the X axis direction. That is, a plurality of second bias wirings 342 which are a portion of the bias wiring 34 are provided on the second surface 302 without providing the bias wiring 34 on the first surface 301 of the wiring substrate 30 over the X axis which is the longitudinal direction so that it is possible to lower the electric resistance value of the bias wiring 34 along the X axis direction, and thereby, the voltage drop due to the shortage of the current capacity of the bias wiring 34 can be suppressed.

Furthermore, the second bias wiring 342 is electrically connected to the common lead electrode 92 at a plurality of positions via the second bump electrode 39 in the Y axis direction. Therefore, the voltage drop of the second electrode 80 in the X axis direction is suppressed, and it is possible to suppress variations in the application of the bias voltage to the respective active portions.

The flow channel formation substrate 10 and the wiring substrate 30 are adhered by an adhesive layer 300. As a result, the second individual wiring 312 and the second bias wiring 342, which are the second bump wirings 392 constituting the second bump electrode 39, and the individual lead electrode 91 and the common lead electrode 92 are fixed while being in contact with each other.

As described above, a holding portion 160 which is a space in which the piezoelectric actuator 150 is disposed is formed between the flow channel formation substrate 10 and the wiring substrate 30 with the adhesive layer 300 bonding the flow channel formation substrate 10 and the wiring substrate 30.

By connecting the second individual wiring 312 and the second bias wiring 342 to the individual lead electrode 91 and the common lead electrode 92 by the second bump electrode 39, it is possible to reduce the load at the time of connection between the wiring substrate 30 and the flow channel formation substrate 10 and to reduce the warpage of the wiring substrate 30 and the flow channel formation substrate 10. As described above, by using the first bump electrode 121 at the time of mounting the driving circuit 120 on the wiring substrate 30, it is possible to prevent the second bump electrode 39 between the wiring substrate 30 and the flow channel formation substrate 10 from being deformed so as to be crushed. That is, in a case of using a metal bump formed only with a metal such as a gold bump at the time of mounting the driving circuit 120 on the wiring substrate 30, the second bump electrode 39 between the wiring substrate 30 and the flow channel formation substrate 10 is deformed so that the second bump electrode 39 is crushed because the load at the time of mounting the driving circuit 120 increases. When the second bump electrode 39 is deformed so as to be crushed, there is a possibility that a short circuit such as contact of the second bump electrode 39 with the adjacent individual lead electrode 91 may occur. When the second bump electrode 39 is deformed so as to be crushed, the distance between the piezoelectric actuator 150 and the wiring substrate 30 is shortened and the piezoelectric actuator 150 abuts against the wiring substrate 30, so that the deformation of the piezoelectric actuator 150 may be hindered. When the second bump electrode 39 is deformed so as to be crushed, the distance between the piezoelectric actuator 150 and the wiring provided on the second surface 302 of the wiring substrate 30 becomes short, and there is a possibility that the wiring comes into contact with the electrode of the piezoelectric actuator 150 and dielectric breakdown occurs due to discharge.

In the present embodiment, since the load at the time of mounting the driving circuit 120 on the wiring substrate 30 using the first bump electrode 121 can be reduced, it is possible to prevent the second bump electrode 39 from being deformed so as to be crushed. Therefore, the distance between the piezoelectric actuator 150 and the wiring substrate 30 can be maintained, and it is possible to prevent the crushed second bump electrode 39 from contacting the adjacent individual lead electrodes 91 or the like and short circuiting. It is possible to prevent the wiring substrate 30 from hindering the deformation of the piezoelectric actuator 150. Furthermore, the contact between the piezoelectric actuator 150 and the wiring provided on the second surface 302 of the wiring substrate 30 and occurrence of dielectric breakdown due to discharge can be suppressed.

In order to suppress the deformation of the second bump electrode 39, a method of bonding the wiring substrate 30 and the flow channel formation substrate 10 after mounting the driving circuit 120 on the wiring substrate 30 is conceivable. However, since the driving circuit 120 is expensive, if the bonding failure between the wiring substrate 30 on which the driving circuit 120 is mounted first and the flow channel formation substrate 10 occurs, the yield decreases and the cost increases. Since the flow channel formation substrate 10 is processed such as anisotropic etching (wet etching) in a state where handling is improved by bonding the wiring substrate 30, the flow channel formation substrate 10 becomes difficult to process when the driving circuit 120 is mounted on the wiring substrate 30 first. Therefore, in view of simplification of the manufacturing process and cost, it is necessary to mount the driving circuit 120 on the wiring substrate 30 after bonding the wiring substrate 30 and the flow channel formation substrate 10, and the deformation of the second bump electrode 39 easily occurs in such a manufacturing process. In the present embodiment, the driving circuit 120 is mounted on the wiring substrate 30 by the first bump electrodes 121 after bonding the wiring substrate 30 and the flow channel formation substrate 10, and thereby, deformation of the second bump electrode 39 can be suppressed.

In the present embodiment, the same material is used for the first core portion 122 of the first bump electrode 121 and the second core portion 391 of the second bump electrode 39. However, the invention is not particularly limited thereto. For example, a material having a Young's modulus higher than that of the first core portion 122 may be used for the second core portion 391. Accordingly, the deformation of the second bump electrode 39 can be further suppressed when the driving circuit 120 is mounted on the wiring substrate 30.

In the present embodiment, it is preferable that the number of the second bump electrodes 39 be larger than the number of the first bump electrodes 121. By thus setting the number of the second bump electrodes 39 to be larger than the number of the first bump electrodes 121, the load at the time of mounting the driving circuit 120 on the wiring substrate 30 is dispersed to the plurality of second bump electrodes 39. Therefore, it is possible to further reduce the deformation of the second bump electrode 39 by reducing the load applied to one second bump electrode 39.

As shown in FIG. 5, it is preferable that the height of the second bump electrode 39 be higher than the height of the first core portion 122 of the first bump electrode 121 in the Z axis direction which is the laminating direction of the wiring substrate 30 and the flow channel formation substrate 10. As a result, even if the second bump electrode 39 is deformed so as to be crushed by the load at the time of mounting the driving circuit 120 on the wiring substrate 30, it is possible to suppress the influence of deformation of the second bump electrode 39, that is, short circuiting due to the above-described second bump electrode 39 contacting the mutually adjacent individual lead electrodes 91, hindrance of deformation of the piezoelectric actuator 150, a short circuit due to contact between the wiring on the second surface 302 of the wiring substrate 30 and the electrode of the piezoelectric actuator 150, and breakdown due to discharge.

It is preferable that the contact area between the second bump electrode 39 and respective individual lead electrode 91 and common lead electrode 92 be larger than the contact area between the first bump electrodes 121 and the respective driving circuits 120. That is, the connection length between the second bump electrode 39 and respective individual lead electrode 91 and common lead electrode 92 is longer than the connection length with each driving circuit 120 of the first bump electrode 121. Accordingly, the load at the time of mounting the driving circuit 120 on the wiring substrate 30 can be supported by the relatively large contact area of the second bump electrode 39 and the deformation of the second bump electrode 39 can be suppressed.

For example, three rows of the second bump electrodes 39 connecting the second individual wirings 312 and the second bias wirings 342 to the individual lead electrodes 91 and the common lead electrodes 92 juxtaposed in the X axis direction are juxtaposed in the Y axis direction. That is, two rows of the second bump electrodes 39 juxtaposed in the X axis direction are provided in the Y axis direction with respect to each of row of the active portions of the piezoelectric actuator 150 juxtaposed in the X axis direction. For such second bump electrode 39, the first bump electrode 121 is provided between rows of the second bump electrodes 39 in the Y axis direction. That is, when seen from the Z axis direction in plan view, the first bump electrode 121 is disposed between the rows of second bump electrodes 39 in the Y axis direction. Therefore, the load at the time of mounting the driving circuit 120 on the wiring substrate 30 can be supported by the second bump electrodes 39 on both sides of the first bump electrode 121, and it possible to suppress the biased deformation of the second bump electrode 39 due to uneven load.

As shown in FIGS. 2 to 4, a case member 40 forming the manifold 100 communicating with the plurality of pressure generation chambers 12 is fixed to the bonded body of the flow channel formation substrate 10, the wiring substrate 30, the communication plate 15, and the nozzle plate 20. The case member 40 has substantially the same shape as the above-described communication plate 15 in plan view, and is bonded to the wiring substrate 30 and to the above-described communication plate 15. Specifically, the case member 40 has a recessed portion 41 with a depth that accommodates the flow channel formation substrate 10 and the wiring substrate 30 on the wiring substrate 30 side. The recessed portion 41 has an opening area larger than the surface of the wiring substrate 30 bonded to the flow channel formation substrate 10. The opening face of the recessed portion 41 on the nozzle plate 20 side is sealed by the communication plate 15 in a state in which the flow channel formation substrate 10 and the like are accommodated in the recessed portion 41. In the case member 40, a third manifold portion 42 having a recessed shape is formed on both sides of the recessed portion 41 in the Y axis direction. The manifold 100 of the present embodiment is constituted by the third manifold portion 42 and the first manifold portion 17 and the second manifold portion 18 provided on the communication plate 15.

The material of the case member 40 can be formed from, for example, resin, metal, or the like. By molding the resin material as the case member 40, it can be mass-produced at low cost.

The compliance substrate 45 is provided on the surface of the communication plate 15 on the nozzle plate 20 side. The compliance substrate 45 seals the openings of the first manifold portion 17 and the second manifold portion 18 on the nozzle plate 20 side. In the present embodiment, such a compliance substrate 45 includes a sealing film 46 and a fixed substrate 47. The sealing film 46 is made of a thin film (for example, a thin film formed of polyphenylene sulfide (PPS), stainless steel (SUS) or the like and having a thickness of 20 µm or less) having flexibility, and the fixed substrate 47 is formed of a hard material such as stainless steel (SUS). Since the region of the fixed substrate 47 facing the manifold 100 is an opening 48 completely removed in the thickness direction, one surface of the manifold 100 is a compliance unit 49 which is a flexible portion sealed only with the flexible sealing film 46.

The case member 40 is provided with an introduction channel 44 for communicating with the manifold 100 and supplying ink to each manifold 100. The case member 40 is provided with a connection port 43 through which the wiring substrate 30 is exposed and the external wiring is inserted, and the external wiring 130 inserted in the connection port 43 is connected to each wiring, that is, the drive signal wiring 32, the power supply wiring 33, and the first bias wiring 341, of the wiring substrate 30.

In the liquid ejecting head 1 having such a configuration, when ink is ejected, the ink is taken from the liquid storage unit in which the ink is stored via the introduction channel 44, and the inside of the flow channel from the manifold 100 to the nozzle opening 21 is filled with the ink. Thereafter, according to the signal from the driving circuit 120, a voltage is applied to each piezoelectric actuator 150 corresponding to the pressure generation chamber 12, and thereby the vibration plate 50 is deflected and deformed together with the piezoelectric actuator 150. Accordingly, the pressure in the pressure generation chambers 12 increases and ink droplets are ejected from the predetermined nozzle openings 21.

As described above, according to the ink jet type liquid ejecting apparatus of the present embodiment, the following effects can be obtained.

In the bonding region surrounded by the wiring substrate 30, the first core portion 122, the first bump wiring 123, and the first individual wiring 311, since the width L1 in the second direction and the width H3 in the first direction are wider than the maximum particle diameter of the solid particles contained in the adhesive 124, when the adhesive 124 flows in the bonding region at the bonding of the wiring substrate 30 and the driving circuit 120, the solid particles such as a curing agent and a filler contained in the adhesive 124 easily spread to the bonding region, and the solid particles are uniformly distributed in the bonding region. Accordingly, the bonding strength between the substrates can be improved. The configuration of the MEMS device described above is appropriately designed according to the fluidity at the time of bonding the adhesive 124 to be used.

Embodiment 2

Figure 8:
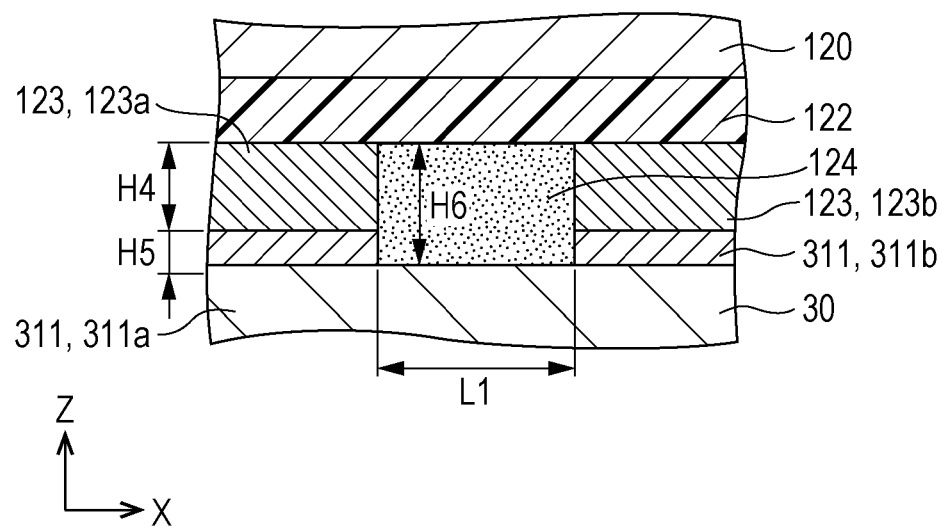
FIG. 8 is a cross-sectional view taken along a line VIII-VIII of FIG. 6 according to Embodiment 2.

FIG. 8 is a cross-sectional view taken along a line VIII-VIII of FIG. 6 according to Embodiment 2. An ink jet type liquid ejecting apparatus according to the embodiment will be described with reference to FIG. 8. For the same constituent parts as those in Embodiment 1, the same numbers are used, and redundant explanation is omitted.

In the cross section in the X axis direction shown in FIG. 8, a film thickness H4 of the first bump wiring 123 or a film thickness H5 of the first individual wiring 311 is formed thicker than the maximum particle diameter of the solid particles contained in the adhesive 124.

In the present embodiment, the film thickness H4 of the first bump wiring 123 is formed so as to be thicker than the maximum particle diameter of the solid particles contained in the adhesive 124. Here, although not shown, the film thickness H5 of the first individual wiring 311 may be formed so as to be thicker than the maximum particle diameter of the solid particles contained in the adhesive 124. Furthermore, the sum of the film thickness H4 of the first bump wiring 123 and the film thickness H5 of the first individual wiring 311 may be formed so as to be thicker than the maximum particle diameter of the solid particles contained in the adhesive 124.

L1, which is the width between the first bump wiring 123a (first wiring) and the first bump wiring 123b (second wiring) adjacent in the X axis direction or the width between the first individual wiring 311a (third wiring) and the first individual wiring 311b (fourth wiring) adjacent in the X axis direction, is formed so as to be wider than the maximum particle diameter of the solid particles contained in the adhesive 124.

In the present embodiment, L1, which is the width between the first bump wiring 123a (first wiring) and the first bump wiring 123b (second wiring) adjacent in the X axis direction and the width between the first individual wiring 311a (third wiring) and the first individual wiring 311b (fourth wiring) adjacent in the X axis direction, is wider than the maximum particle diameter of the solid particles contained in the adhesive 124.

As described above, according to the ink jet type liquid ejecting apparatus of the present embodiment, the following effects can be obtained.

In the bonding region surrounded by the wiring substrate 30, the first core portion 122, the first bump wiring 123, and the first individual wiring 311, since the width L1 in the second direction and a width H6 in the first direction are wider than the maximum particle diameter of the solid particles contained in the adhesive 124, when the adhesive 124 flows in the bonding region at the bonding of the wiring substrate 30 and the driving circuit 120, solid particles such as a curing agent and a filler contained in the adhesive 124 easily spread to the bonding region, and solid particles are uniformly distributed in the bonding region. Accordingly, the bonding strength between the substrates can be improved. The configuration of the MEMS device described above is appropriately designed according to the fluidity at the time of bonding the adhesive 124 to be used.

Embodiment 3

Figure 9:
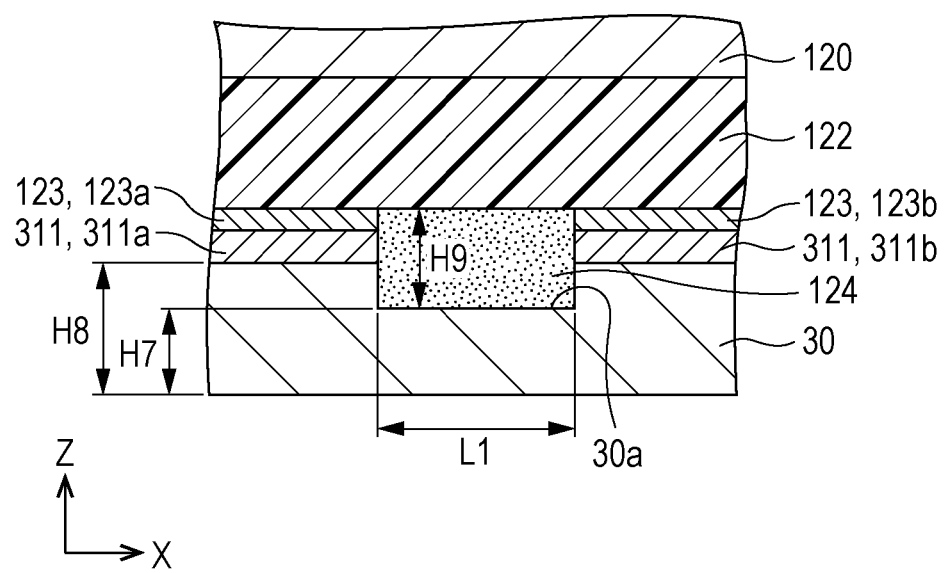
FIG. 9 is a cross-sectional view taken along a line IX-IX of FIG. 6 according to Embodiment 3.

FIG. 9 is a cross-sectional view taken along a line IX-IX of FIG. 6 according to Embodiment 3. An ink jet type liquid ejecting apparatus according to the embodiment will be described with reference to FIG. 9. For the same constituent parts as those in Embodiment 1, the same numbers are used, and redundant explanation is omitted.

In the cross section in the Z axis direction (cross-sectional view in the first direction) shown in FIG. 9, a thickness H7 of the wiring substrate 30 in the region between the first individual wiring 311a (third wiring) and the first individual wiring 311b (fourth wiring) formed on the upper surface of the wiring substrate 30 is formed thinner than a thickness H8 of the region where the first individual wiring 311a or the first individual wiring 311b is formed. That is, a recessed portion is formed in the wiring substrate 30. Here, a width H9 of the wiring substrate from the recess bottom surface 30a to the first core portion 122 is formed so as to be wider than the maximum particle diameter of the solid particles contained in the adhesive 124. Such a recessed portion of the wiring substrate 30 can be formed by a photolithography technique or an etching technique.

L1, which is the width between the first bump wiring 123a (first wiring) and the first bump wiring 123b (second wiring) adjacent in the X axis direction or the width between the first individual wiring 311a (third wiring) and the first individual wiring 311b (fourth wiring) adjacent in the X axis direction, is formed so as to be wider than the maximum particle diameter of the solid particles contained in the adhesive 124.

In the present embodiment, L1, which is the width between the first bump wiring 123a (first wiring) and the first bump wiring 123b (second wiring) adjacent in the X axis direction and the width between the first individual wiring 311a (third wiring) and the first individual wiring 311b (fourth wiring) adjacent in the X axis direction, is wider than the maximum particle diameter of the solid particles contained in the adhesive 124.

As described above, according to the ink jet type liquid ejecting apparatus of the present embodiment, the following effects can be obtained.

In the bonding region surrounded by the wiring substrate 30, the first core portion 122, the first bump wiring 123, and the first individual wiring 311, since the width L1 in the second direction and the width H9 in the first direction are wider than the maximum particle diameter of the solid particles contained in the adhesive 124, when the adhesive 124 flows in the bonding region at the bonding of the wiring substrate 30 and the driving circuit 120, solid particles such as a curing agent and a filler contained in the adhesive 124 easily spread to the bonding region, and the solid particles are uniformly distributed in the bonding region. Accordingly, the bonding strength between the substrates can be improved. The configuration of the MEMS device described above is appropriately designed according to the fluidity at the time of bonding the adhesive 124 to be used.

Embodiment 4

Figure 10:
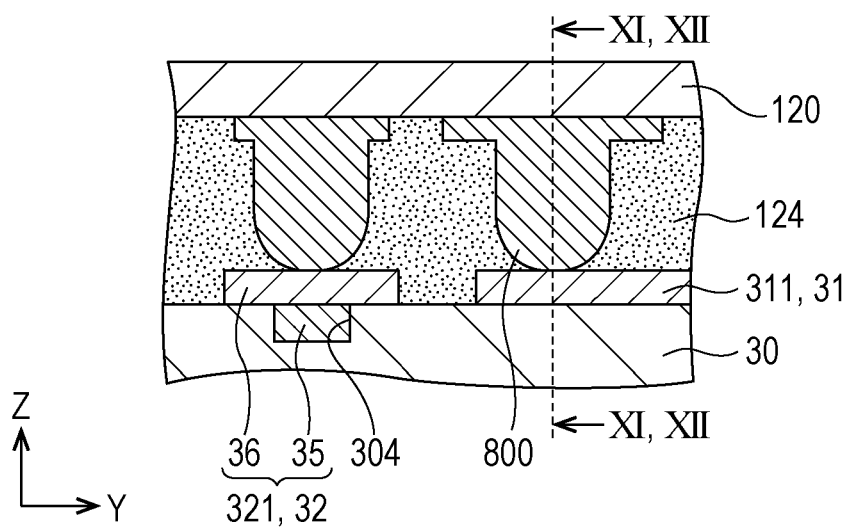
FIG. 10 is a sectional view using a metal bump of FIG. 6 according to Embodiment 4.
Figure 11:
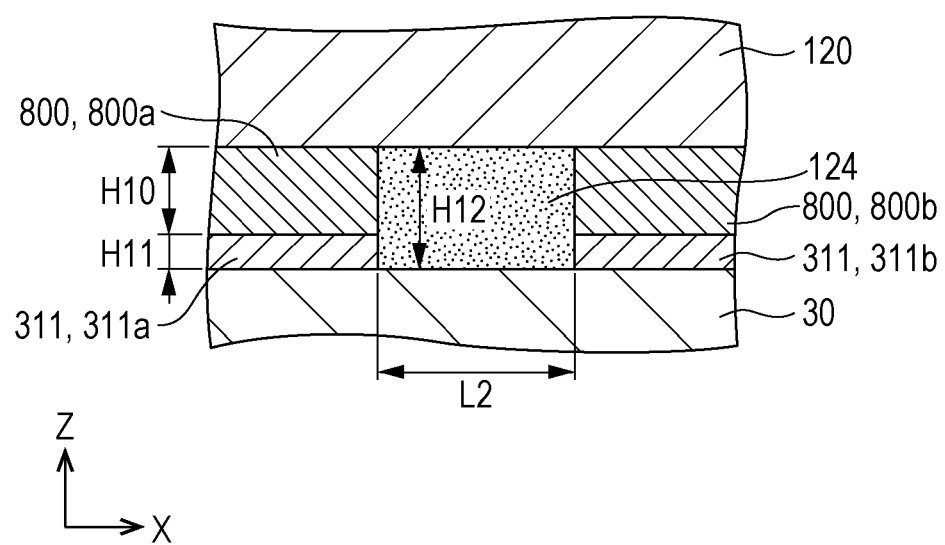
FIG. 11 is a cross-sectional view taken along a line XI-XI of FIG. 10 according to Embodiment 4.

FIG. 10 is a sectional view in which the first core portion 122 of FIG. 6 according to Embodiment 4 and the first bump wiring 123 are changed to a first metal bump electrode 800 (a plurality of bumps including a first bump and a second bump), and FIG. 11 is a cross-sectional view taken along a line XI-XI of FIG. 10 according to Embodiment 4. An ink jet type liquid ejecting apparatus according to the embodiment will be described with reference to FIG. 10. For the same constituent parts as those in Embodiment 1, the same numbers are used, and redundant explanation is omitted.

As shown in FIG. 10, the driving circuit 120 and the wiring substrate 30 are electrically connected to each other via the first metal bump electrode 800 on the driving circuit and the first individual wiring 311 on the wiring substrate. The first metal bump electrode 800 is a metal bump formed only with metal, and a gold bump is used in the present embodiment.

In the cross section in the X axis direction shown in FIG. 11, a film thickness H10 of the first metal bump electrode 800 or a film thickness H11 of the first individual wiring 311 is formed so as to be thicker than the maximum particle diameter of the solid particles contained in the adhesive 124.

In the present embodiment, the film thickness H10 of the first metal bump electrode 800 is formed so as to be thicker than the maximum particle diameter of the solid particles contained in the adhesive 124. Here, although not shown, the film thickness H11 of the first individual wiring 311 may be formed so as to be thicker than the maximum particle diameter of the solid particles contained in the adhesive 124. Furthermore, the sum of the film thickness H10 of the first metal bump electrode 800 and the film thickness H11 of the first individual wiring 311 may be formed so as to be thicker than the maximum particle diameter of the solid particles contained in the adhesive 124.

L2, which is the width between a first metal bump electrode 800a (first bump) and a first metal bump electrode 800b (second bump) adjacent in the X axis direction or the width between the first individual wiring 311a (third wiring) and the first individual wiring 311b (fourth wiring) adjacent in the X axis direction, is formed so as to be wider than the maximum particle diameter of the solid particles contained in the adhesive 124.

In the present embodiment, L2, which is the width between the first metal bump electrode 800a (first bump) and the first metal bump electrode 800b (second bump) adjacent in the X axis direction and the width between the first individual wiring 311a (third wiring) and the first individual wiring 311b (fourth wiring) adjacent in the X axis direction, is wider than the maximum particle diameter of the solid particles contained in the adhesive 124.

As described above, according to the ink jet type liquid ejecting apparatus of the present embodiment, the following effects can be obtained.

In the bonding region surrounded by the wiring substrate 30, the driving circuit 120, the first metal bump electrode 800, and the first individual wiring 311, since the width L2 in the second direction and a width H12 in the first direction are wider than the maximum particle diameter of the solid particles contained in the adhesive 124, when the adhesive 124 flows in the bonding region at the bonding of the wiring substrate 30 and the driving circuit 120, solid particles such as a curing agent and a filler contained in the adhesive 124 easily spread to the bonding region, and the solid particles are uniformly distributed in the bonding region. Accordingly, the bonding strength between the substrates can be improved. The configuration of the MEMS device described above is appropriately designed according to the fluidity at the time of bonding the adhesive 124 to be used.

Embodiment 5

Figure 12:
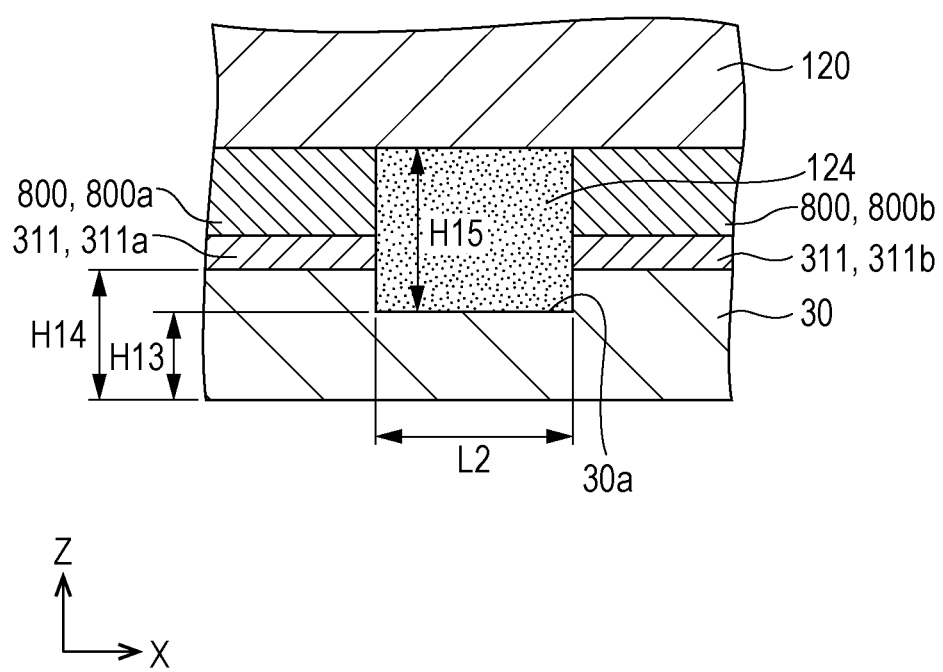
FIG. 12 is a cross-sectional view taken along a line XII-XII of FIG. 10 according to Embodiment 5.

FIG. 12 is a cross-sectional view taken along a line XII-XII of FIG. 10 according to Embodiment 5. An ink jet type liquid ejecting apparatus according to the embodiment will be described with reference to FIG. 12. The same reference numerals are used for the same constituent parts as those of Embodiment 1 and Embodiment 4, and redundant explanations are omitted.

In the cross section in the Z axis direction (cross sectional view in the first direction) shown in FIG. 12, a thickness H13 of the wiring substrate 30 in the region between the first metal bump electrode 800a (first bump) and the first metal bump electrode 800b (second bump) is formed thinner than a thickness H14 of the region to be bonded to the first metal bump electrode 800a or the first metal bump electrode 800b. In other words, the thickness H13 of the wiring substrate 30 in the region between the first individual wiring 311a (third wiring) and the first individual wiring 311b (fourth wiring) formed on the upper surface of the wiring substrate 30 is formed thinner than a thickness H14 of the region where the first individual wiring 311a or the first individual wiring 311b is formed. That is, a recessed portion is formed in the wiring substrate 30. Here, a width H15 of the wiring substrate from the recess bottom surface 30a to the driving circuit 120 is formed so as to be wider than the maximum particle diameter of the solid particles contained in the adhesive 124. Such a recessed portion of the wiring substrate 30 can be formed by a photolithography technique or an etching technique.

L2, which is the width between the first metal bump electrode 800a (first bump) and the first metal bump electrode 800b (second bump) adjacent in the X axis direction or the width between the first individual wiring 311a (third wiring) and the first individual wiring 311b (fourth wiring) adjacent in the X axis direction, is formed so as to be wider than the maximum particle diameter of the solid particles contained in the adhesive 124.

In the present embodiment, L2, which is the width between the first metal bump electrode 800a (first bump) and the first metal bump electrode 800b (second bump) adjacent in the X axis direction and the width between the first individual wiring 311a (third wiring) and the first individual wiring 311b (fourth wiring) adjacent in the X axis direction, is wider than the maximum particle diameter of the solid particles contained in the adhesive 124.

As described above, according to the ink jet type liquid ejecting apparatus of the present embodiment, the following effects can be obtained.

In the bonding region surrounded by the wiring substrate 30, the driving circuit 120, the first metal bump electrode 800, and the first individual wiring 311, since the width L2 in the second direction and the width H15 in the first direction are wider than the maximum particle diameter of the solid particles contained in the adhesive 124, when the adhesive 124 flows in the bonding region at the bonding of the wiring substrate 30 and the driving circuit 120, the solid particles such as a curing agent and a filler contained in the adhesive 124 easily spread to the bonding region, and solid particles are uniformly distributed in the bonding region. Thereby, the bonding strength between the substrates can be improved.

What is claimed is:

1. A MEMS device comprising:
a first substrate;
a resin formed on the first substrate;
a first wiring formed on the resin in a first area;
a second wiring formed on the resin in a second area;
a second substrate;
a third wiring formed on the second substrate in the first area;
a fourth wiring formed on the second substrate in the second area,
wherein the first substrate and the second substrate are bonded to each other via an adhesive,
wherein the first substrate and the second substrate are electrically connected to each other via the first wiring and the third wiring in the first area,
wherein the first substrate and the second substrate are electrically connected to each other via the second wiring and the fourth wiring in the second area,
wherein a width between the resin and the second substrate in a third area is wider than both of a width between the resin and the second substrate in the first area and a width between the resin and the second substrate in the second area, the third area being an area disposed between the first area and second area, and each width being width in a first direction that is a direction in which the resin and the plurality of wirings are laminated.

2. The MEMS device according to claim 1,
wherein, in a cross-sectional view in the first direction, a film thickness of the resin in a region between the first wiring and the second wiring is thinner than the film thickness of the resin in a region where the first wiring or the second wiring is formed.

3. The MEMS device according to claim 1,
wherein, in a cross-sectional view in the first direction, a thickness of the second substrate in a region between the third wiring and the fourth wiring is thinner than a thickness of the second substrate in a region where the third wiring or the fourth wiring is formed.

4. The MEMS device according to claim 1, wherein the resin is extended across the first area and the second area and the third area continuously.

5. The MEMS device according to claim 1,
wherein the first wiring and the second wiring are not formed in the third area so as not to contact each other, and
wherein the third wiring and the fourth wiring are not formed in the third area so as not to contact each other.

6. The MEMS device according to claim 1,
wherein the adhesive contains solid particles,
wherein, in the first direction, a width between the resin and the second substrate is wider than a maximum particle diameter of the solid particles, and
wherein a width between the first wiring and the second wiring or a width between the third wiring and the fourth wiring is wider than the maximum particle diameter of the solid particles.

7. The MEMS device according to claim 6, wherein a film thickness of the first wiring and the second wiring or a film thickness of the third wiring and the fourth wiring is thicker than the maximum particle diameter of the solid particles.

8. The MEMS device according to claim 1, wherein a position of the first wiring in the first direction and a position of the second wiring in the first direction are same.

9. The MEMS device according to claim 8, wherein a position of the third wiring in the first direction and a position of the fourth wiring in the first direction are same.

10. The MEMS device according to claim 9, wherein a position of the third wiring in a second direction that is orthogonal to the first direction and a position of the first wiring in the second direction are same.

11. The MEMS device according to claim 10, wherein a position of the fourth wiring in the second direction and a position of the second wiring in the second direction are same.

* * * * *